(12) United States Patent
Dawson et al.

(10) Patent No.: US 6,728,912 B2
(45) Date of Patent: Apr. 27, 2004

(54) SOI CELL STABILITY TEST METHOD

(75) Inventors: James W. Dawson, Poughkeepsie, NY (US); Paul A. Bunce, Poughkeepsie, NY (US); Donald W. Plass, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 09/833,724

(22) Filed: Apr. 12, 2001

(65) Prior Publication Data
US 2002/0152434 A1 Oct. 17, 2002

(51) Int. Cl.$^7$ ................................................ G11C 29/00
(52) U.S. Cl. ........................................ 714/718; 365/201
(58) Field of Search ............................ 714/718; 365/201

(56) References Cited

U.S. PATENT DOCUMENTS 6,275,427 B1 * 8/2001 Aipperspach et al. ....... 365/201

OTHER PUBLICATIONS

Joshi et al., SOI for asynchronous dynamic circuits, Mar. 2001, NEC research index. pp. 1–6.*

Joshi et al., Design considerations nad implementations of a high performance dynamic register file, Jan. 1999, IEEE, pp. 526–531.*

Fossum et al., Design issues and insights for low–voltage high density SOI DRAM, May 1998, IEEE<Trans. on Elect. Devices, vol. 45, No. 5., pp. 1055–1062.*

* cited by examiner

Primary Examiner—Albert Decady
Assistant Examiner—Shelly A Chase
(74) Attorney, Agent, or Firm—Lynn L. Augspurger

(57) ABSTRACT

A method for testing SOI technology memory circuits, such as in SRAMs, for weak SOI cells, uses a reset test circuit with a wordline pulse width control circuit which can be implemented without performance impact and allows using unused silicon to minimize area usage impact and permits screening of integrated SOI memory array circuits for weak SOI cells using the test reset circuit to selectively change the wordline pulse width to a reduced time while the memory cell bit select and write signals turn off at normal times to stress the cell write margin. Further, during test, the word line pulse width can be extended by blocking the reset signal of the reset path test circuit to the word path to produce a longer than normal pulse width. In addition, during a test for normal operations the reset signal is allowed to pass through a pass gate multiplexer of the reset test circuit.

4 Claims, 2 Drawing Sheets

SOI CELL STABILITY TEST METHOD

RELATED APPLICATIONS

Aipperspach et al., filed Apr. 19, 2000, Ser. No. 09/552,410 and assigned to IBM and entitled "Stability test for Silicon On Insulator SRAM Memory Cells Utilizing Bitline Precharge Stress Operations to Stress Memory Cells Under"; and Aipperspach et al., ", filed Apr. 19, 2000, Ser. No. 09/552,119, now U.S. Pat. No. 6,275,427 entitled "Stability Test for Silicon on Insulator SRAM Memory Cells Utilizing Disturb Operations to Stress Memory Cells Under Test".

These co-pending applications and the present application are owned by one and the same assignee, International Business Machines Corporation of Armonk, N.Y.

The descriptions set forth in these co-pending applications are hereby incorporated into the present application by this reference.

FIELD OF THE INVENTION

This invention relates to Silicon On Insulator (SOI) Devices and in particular to a cell stability test method and therefore useful for weak SOI memory cell testing.

Trademarks: IBM is a registered trademark of International Business Machines Corporation, Armonk, N.Y., U.S.A. Other names may be registered trademarks or product names of International Business Machines Corporation or other companies.

BACKGROUND

Within IBM tests not yet published have been developed for memory cells manufactured with SOI technologies which extended the wordline pulse width of the memory beyond the end of the cycle to stress the cell in a half word select state. Simulation analysis has shown that this is a worst condition for this type of instability.

One such unpublished test method is disclosed in co-pending application by Aipperspach et al., filed Apr. 19, 2000, Ser. No. 09/552,410 and assigned to IBM and entitled "STABILITY TEST FOR SILICON ON INSULATOR SRAM MEMORY CELLS UTILIZING BITLINE PRECHARGE STRESS OPERATIONS TO STRESS MEMORY CELLS UNDER TEST" describing an apparatus, program product, and method of testing a silicon-on-insulator (SOI) static random access memory (SRAM) to introduce switching history effects to a memory cell during testing to stress the memory cell such that a reliable determination of stability may be made. In that disclosed development stress is applied to a memory cell through the use of a bitline precharge stress operation, which utilizes the bitline pairs coupled to a memory cell to attempt to flood the memory cell with charge and thereby attempt to cause the memory cell to unexpectedly switch state. The bitline precharge stress operation is performed immediately after the memory cell has been switched to one state after being maintained in an opposite state for a length of time that is sufficient to introduce switching history effects to the memory cell. While a bitline precharge operation may be implemented separate from any write operation, the bitline precharge stress operation may also be incorporated into a write operation through delaying the deassertion of the wordline that occurs in a conventional write operation until after initiation of the bitline precharge operation that conventionally occurs near the end of such a write operation. Within that described application filed Apr. 19, 2000, Ser. No. 09/552,410 and assigned to IBM and entitled "STABILITY TEST FOR SILICON ON INSULATOR SRAM MEMORY CELLS UTILIZING BITLINE PRECHARGE STRESS OPERATIONS TO STRESS MEMORY CELLS UNDER TEST" there is disclosed a method of testing a silicon-on-insulator (SOI) static random access memory (SRAM) comprising: (a) introducing switching history effects to an SOI SRAM memory cell by maintaining the memory cell in a first state for a period of time, the memory cell including a pair of pass gates respectively coupled to a pair of bitlines and activated by a wordline; (b) setting the memory cell to a second state after introducing the switching history effects; (c) stressing the memory cell after setting the memory cell to the second state by asserting the wordline after initiating precharging of the pair of bitlines; and (d) determining the current state of the memory cell after stressing the memory cell to confirm whether the memory cell is still in the second state. While considered background with respect to our invention, this described application is co-pending and is incorporated herein by reference.

In still another co-pending application by Aipperspach et al., is entitled "Stability Test for Silicon on Insulator SRAM Memory Cells Utilizing Disturb Operations to Stress Memory Cells Under Test", filed Apr. 19, 2000, Ser. No. 09/552,119 and assigned to IBM, which describes an apparatus, program product, and method of testing a silicon-on-insulator (SOI) static random access memory (SRAM) to introduce switching history effects to a memory cell under test to stress the memory cell such that a reliable determination of stability may be made. There it was stated that it has been found that the worst case scenario for memory cell stability typically occurs immediately after a memory cell is switched to one state after the memory cell has been maintained in the other, opposite state for a period of time sufficient to introduce switching history effects. As such, a testing process may be configured to maintain a memory cell in a particular state for a period of time sufficient to introduce switching history effects, whereby the memory cell may be adequately stressed during the testing process to highlight any stability problems by setting the memory cell to an opposite state, and then shortly thereafter disturbing the memory cell, e.g., via a read to the memory cell or another memory cell on the same column or row of a memory array.

The co-pending application by Aipperspach et al., entitled "Stability Test for Silicon on Insulator SRAM Memory Cells Utilizing Disturb Operations to Stress Memory Cells Under Test", filed Apr. 19, 2000, Ser. No. 09/552,119 describes a method of testing a silicon-on-insulator (SOI) static random access memory (SRAM) comprising: (a) introducing switching history effects to an SOI SRAM memory cell by maintaining the memory cell in a first state for a period of time; (b) setting the memory cell to a second state after introducing the switching history effects; (c) disturbing the memory cell after setting the memory cell to the second state; and (d) determining the current state of the memory cell after disturbing the memory cell to confirm whether the memory cell is still in the second state. While also considered background with respect to our invention, this described application is co-pending and is incorporated herein by reference.

An improved test using a new reset test circuit is described herein below.

SUMMARY OF THE INVENTION

Described is a method for testing SOI technology memory circuits, such as in SRAMs, for weak SOI cells, using a reset test circuit with a wordline pulse width control circuit which can be implemented without performance impact and allows using unused silicon to minimize area usage impact and permits screening of integrated SOI memory array circuits for weak SOI cells using the test reset circuit which allows using a clock signal to reset the circuits being tested at the end of each clock cycle.

The method includes causing a selected circuit of an integrated SOI memory array circuit having a plurality of memory cells, each memory cell having a word select path and a bit select path to activate a reset path test circuit having a word select path and a bit select path which provide independent timed paths and having a pass gate multiplexer and a clock to reset the circuits being tested at the end of each clock cycle to test the SOI memory array memory cells by selectively changing signals passing through said reset test circuit to provide a wordline pulse width signal for a word select path with a reduced time while the memory cell bit path select and write signals turn off at normal times to stress the cell write margin.

Further, during test, the word line pulse width can be extended by blocking the reset signal with the wordline control circuit to produce a longer than normal pulse width. In addition, during a test for normal operations the reset signal is allowed to pass through the pass gate multiplexer of the wordline control circuit.

These and other improvements are set forth in the following detailed description. For a better understanding of the invention with advantages and features, refer to the description and to the drawings.

Our detailed description explains the preferred embodiments of our invention, together with advantages and features, by way of example with reference to the drawings.

DETAILED DESCRIPTION OF THE INVENTION

Figure 1:
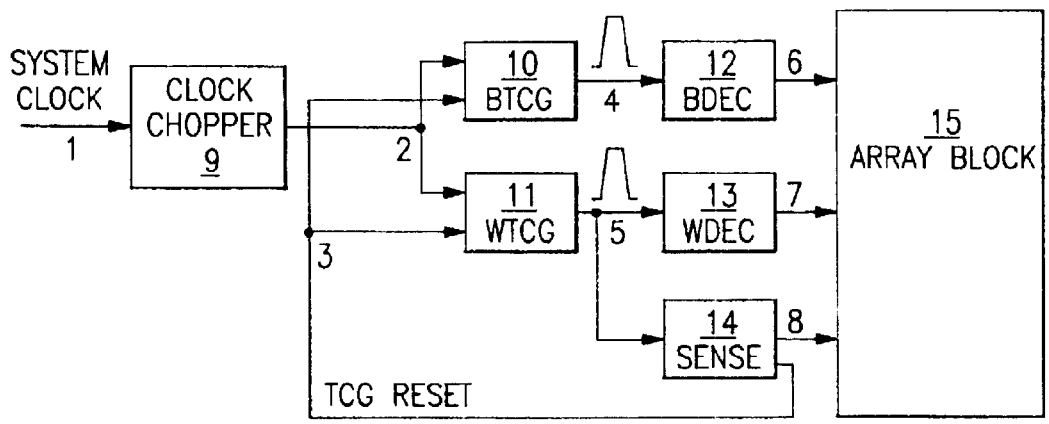
FIG. 1 illustrates a typical reset path for a memory cell, such as an SRAM.

FIG. 1 illustrates a typical reset path for a memory cell, such as an SRAM useable in the prior IBM test described in the background. The system clock (1) triggers the clock chopper (9) which causes the bit true/complement generator (BTCG) (10) and the word true/complement generator (WTCG) (11) outputs (nodes 4 and 5 respectively) to select (go high). When nodes 4 and 5 are high, the bit decoder (12) and word decoder (13) are active and they select the desired location from within the array block (15). The word TCG output (5) also actives the sense clock (14), which is used to evaluated the data within the array block, at the desired location. The sense clock (14) also creates a TCG reset signal (3), which causes nodes 4 and 5 to shut off (go low). The width of the BTCG output pulse (4) controls the bit select pulse width (6) within the array block. The width of the WTCG output pulse (5) controls the wordline pulse width (7) within the memory cell array block.

A test of integrated SOI memory cell circuits has been developed for testing the memory cells manufactured with SOI technologies by extending the wordline pulse width timing for the memory beyond the end of the cycle with a reset path wordline control circuit while allowing the wordline pulse width to be reduced to stress the cell write margin by testing changes to the wordline pulse width while the memory cell bit select and write signals turn off at normal times.

Figure 2:
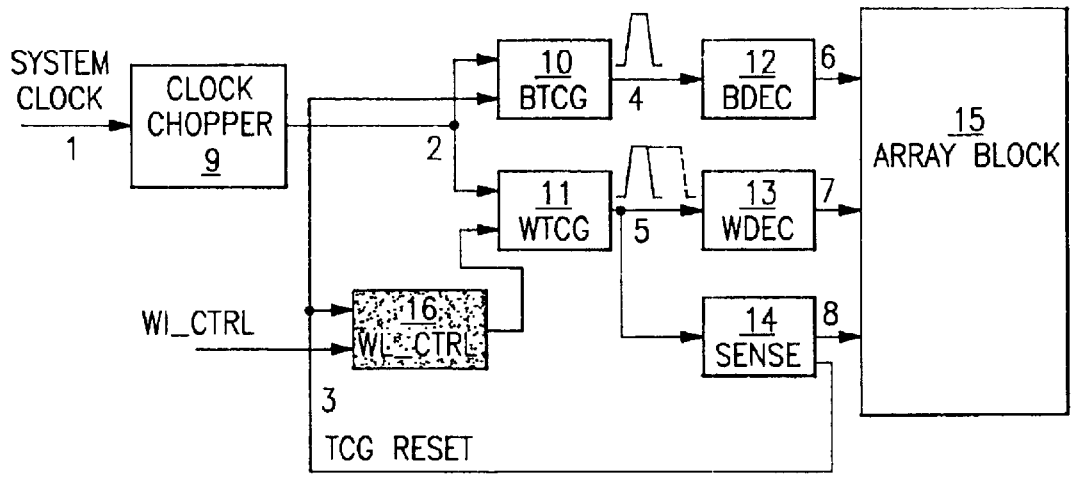
FIG. 2 illustrates the same path as FIG. 1, with the preferred embodiment of a new wordline control circuit used for testing the device.

In accordance with the preferred embodiment, using the reset path circuit shown in FIG. 2 as an improvement to a prior unpublished IBM design illustrated by FIG. 1, the wordline control circuit is used to selectively change the wordline pulse width to a reduced time while the memory cell bit select and write signals turn off at normal times.

In accordance with the invention the test uses a clock signal to reset the circuits being tested at the end of each clock cycle. Unlike FIG. 1, which has a reset patch with word and bit paths which are independent but have identical timings, the reset path circuit of FIG. 2 utilizes a wordline control circuit inserted in the reset of word path of the reset path circuit which allows timings of the word path of the reset path circuit. For instance in the preferred embodiment, the wordline timings are reset in the circuit under test with independent word path and bit paths operating at a timing differently than others.

In accordance with the invention, during test, the wordline pulse width is initiated in chop mode. The word path reset clock is held active at all times. Accordingly, the word path resets as soon as a clock signal C2 changes and goes low. This occurs much sooner during test than the normal reset clock change would occur.

Further, during test, the word line pulse width is extended. The reset signal is blocked by shutting off the pass gate multiplexer of the wordline control circuit. During the extended word line pulse width test, the word path reset signal is controlled by the RC time constant in the WTCG circuit. This results in a longer than normal pulse width.

The circuit under test can with the new reset path be tested with a normal word length pulse width mode test. In this test the inputs to the wordline control circuit are such that the reset signal passed through the pass gate multiplexer of the wordline control circuit.

Figure 3:
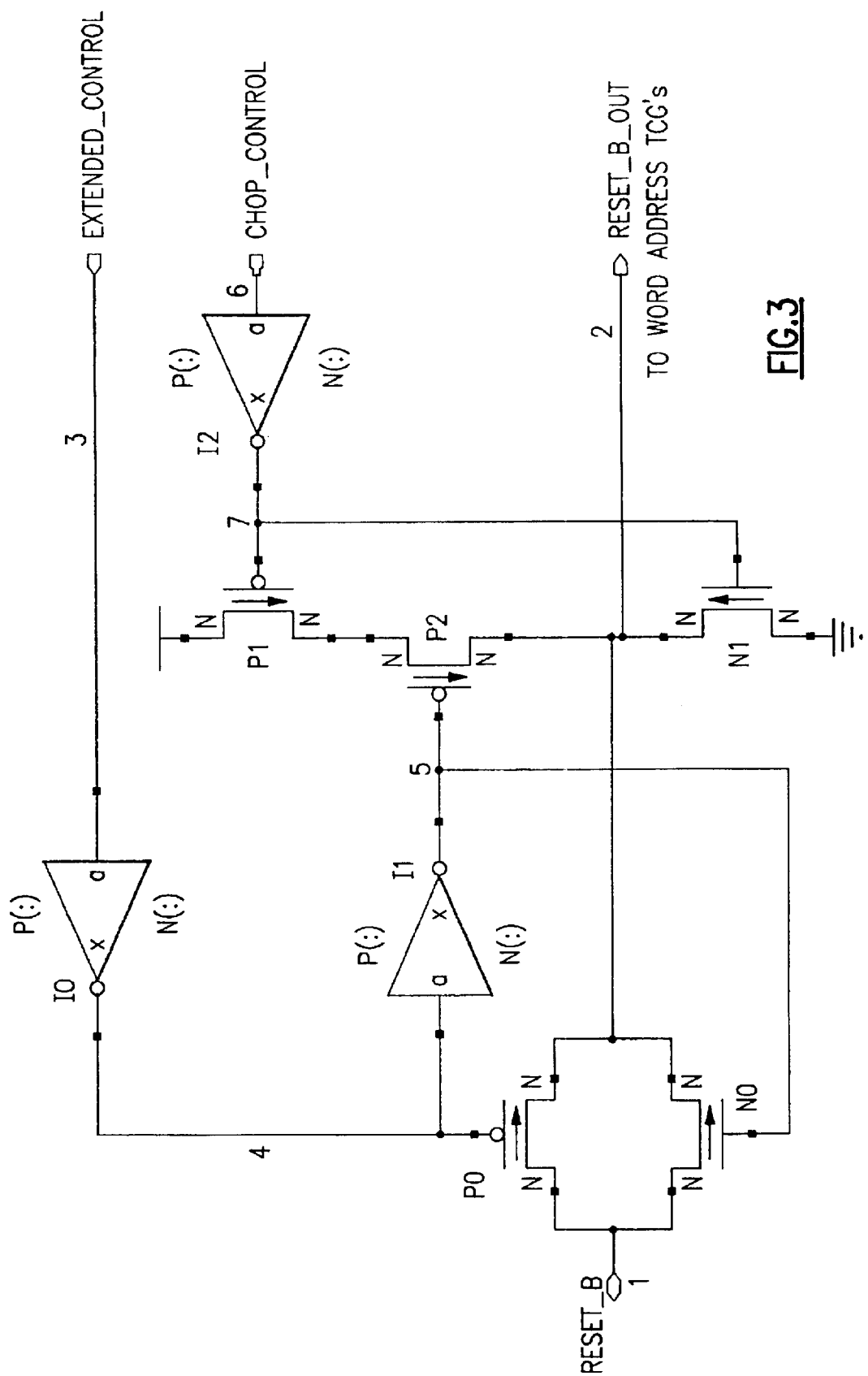
FIG. 3 illustrates the details of the wordline control circuit.

Our preferred embodiment uses the reset path circuits, including the wordline pulse width control circuit described with respect to the FIGS. 2 and 3.

FIG. 2 illustrates the same path as FIG. 1, with the preferred embodiment of a new wordline control circuit used for testing the device. The wordline control circuit (16) is inserted into the reset path (3) for the WTCG (11). This allows the WTCG output (5), and therefore the wordline (7), to be reset differently than the BTCG output (4). By controlling the wordline pulse width (7) differently than the bit select pulse width (6), the cell write margin of the memory cells can be stressed with reduced wordline pulse width, cell stability of the memory cells can be tested with extended wordline pulse width, and normal operation of the memory cells can occur with normal wordline pulse width signals.

FIG. 3 illustrates the details of the wordline control circuit. The input to this wordline control circuit is node 1, which is the reset signal to be controlled. Node 2 is the output of the circuit. Node 3 is the extend control input to the circuit. Node 6 is the chop control input to the circuit. When the extend control node (3) is high and chop control node (6) is high, pmos device P0 and nmos device N0 are both on, and pmos devices P1 and P2 and nmos device N1 are all off. This allows the input node (1) to pass directly to the output (2). When the extend control node (3) is low and chop control node (6) is high, pmos device P0 and nmos device NO are both off, and pmos devices P1 and P2 are both on and nmos device N1 is off. This keeps the circuit output (2) high at all times. With the output node (2) high, the reset of the WTCG is delayed resulting in an extended wordline pulse width. When the extend control node (3) is low and chop control node (6) is low, pmos device P0 and nmos device N0 are both off, and pmos device P1 is off and pmos device P2 is on and nmos device N1 is on. This keeps the circuit output (2) low at all times. With the output node (2) low, the reset of the WTCG is controlled by the earlier clock signal C2 resulting in a chopped wordline pulse width. When the extend control node (3) is high and the chop control node (6) is low, pmos device P0 and nmos device N0 are both on, pmos devices P1 and P2 are both off and nmos device N1 is on. This is an illegal state.

We have concluded that the test described above with respect to FIGS. 2 and 3 particularly is an improvement over other kinds of tests we have envisioned. It is possible to screen weak memory cells with ABIST (Array Built In Self Test) using very long times. This test is not as effective as the described test since the body of the SOI device recovers somewhat with the test described in the preferred embodiment. With the extended word line pulse width test, the cell under test immediately goes to a half word select state which has been shown to be a worst case. Also the ABIST approach does not allow a wordline pulse width to be reduced by chopping.

Another method we have envisioned would be the generation of a non-reset clock specifically for the wordline drive so the wordline stays on as long as the clock. This clock would have to be designed to provide a normal wordline pulse width as well as an extended pulse with. This approach is not as good as the preferred embodiment and does not allow for the wordline pulse width to be shortened for write margin sharing.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for testing SOI technology memory circuits for weak SOI cells comprising the steps of:

causing a selected circuit of an integrated SOI memory array circuit having a plurality of memory cells, each memory cell having a word select path and a bit select path to activate a reset path test circuit having a word select path and a bit select path which provide independent timed paths and having a pass gate multiplexer and a clock to reset the circuits being tested at the end of each clock cycle to test the SOI memory array memory cells by selectively changing signals passing through said reset path test circuit to provide for a memory cell being tested a wordline pulse width signal for a word select path with a reduced time while bit path select and write signals for said memory cell being tested turn off at normal times to stress the write margin of said memory cell being tested.

2. The method according to claim 1 wherein the test further comprises, during test, causing the word line pulse width to be extended by blocking the reset signal of said reset path test circuit to produce a longer than normal pulse width.

3. The method according to claim 2 wherein the test further comprises, in addition, during a test, testing for normal operations by allowing the memory cell reset signal to pass through a pass gate multiplexer of the reset path test circuit.

4. The method according to claim 3 wherein said reset path test circuit has a system clock signal which triggers a clock chopper which causes a bit true/complement generator (BTCG) and a word true/complement generator (WTCG) outputs of said reset path test circuit having independent bit path and word paths to select by going high, such that when said bit true/complement generator (BTCG) and a word true/complement generator (WTCG) ouputs are high, a bit decoder and word decoder of said reset path test circuit are active and select a desired location within the memory cell array block for testing of an SOI memory cell therein and wherein the width of the word true/complement generator (WTCG) output pulse controls the wordline pulse width within said memory cell array block and wherein the reset path test circuit has a wordline control circuit in the reset path of said word true/complement generator (WTCG) used for testing the SOI memory cell allowing said word true/complement generator (WTCG) output and the wordline of said memory cell to be reset differently than said bit true/complement generator (BTCG) output for controlling said reset path circuit's wordline pulse width differently than said reset path circuit's bit select pulse width to stress said memory cell's write margin with reduced as well as extended and normal timing test signals.

* * * * *